(12) United States Patent
Kammerl et al.

(10) Patent No.: US 11,332,325 B2
(45) Date of Patent: May 17, 2022

(54) APPARATUS FOR COATING CONTAINERS WITH BYPASS AND METHOD FOR OPERATING SUCH AN APPARATUS

(71) Applicant: KRONES AG, Neutraubling (DE)

(72) Inventors: Martin Kammerl, Hemau (DE); Michael Neubauer, Grassau (DE); Klaus Voth, Obertraubling (DE)

(73) Assignee: KRONES AG, Neutraubling (DE)

( * ) Notice: Subject to any disclaimer, the term of this patent is extended or adjusted under 35 U.S.C. 154(b) by 0 days.

(21) Appl. No.: 17/032,004

(22) Filed: Sep. 25, 2020

(65) Prior Publication Data

US 2021/0094769 A1    Apr. 1, 2021

(30) Foreign Application Priority Data

Sep. 30, 2019  (DE) ...................... 10 2019 126 291.7

(51) Int. Cl.
*B65G 54/02* (2006.01)
*B65G 47/84* (2006.01)
*B65G 47/51* (2006.01)

(52) U.S. Cl.
CPC ............ *B65G 54/02* (2013.01); *B65G 47/51* (2013.01); *B65G 47/841* (2013.01)

(58) Field of Classification Search
CPC ................ B65G 54/02; B65G 47/841; B65G 2201/0244; B65G 47/5104; B65G 47/5113; B65G 47/5136
USPC ..................................................... 198/347.1
See application file for complete search history.

(56) References Cited

U.S. PATENT DOCUMENTS

| | | | | |
|---|---|---|---|---|
| 4,570,783 A | * | 2/1986 | Newcom ............ | B65G 47/5113 198/347.1 |
| 2013/0032448 A1 | * | 2/2013 | Huettner ............ | B65G 47/5104 198/347.1 |
| 2013/0037377 A1 | * | 2/2013 | Drenguis ........... | B65G 47/5154 198/347.1 |

FOREIGN PATENT DOCUMENTS

| | | |
|---|---|---|
| DE | 10 2013 112 091 A1 | 5/2015 |
| DE | 10 2016 105 548 A1 | 9/2017 |
| DE | 10 2018 132 609 A1 | 6/2020 |
| EP | 3 044 133 B1 | 7/2016 |
| WO | 2015/036196 A2 | 3/2015 |
| WO | 2015036196 A1 | 3/2015 |
| WO | 2017/162509 A1 | 9/2017 |

* cited by examiner

*Primary Examiner* — James R Bidwell
(74) *Attorney, Agent, or Firm* — Schmeiser, Olsen & Watts, LLP

(57) ABSTRACT

Provided is an apparatus for coating containers having an inlet where containers are handed over to the apparatus, and an outlet where containers leave the apparatus, having at least one vacuum device for producing a vacuum, having at least one treatment station for coating containers with a plasma, wherein the treatment stations are in fluid connection with the vacuum device and wherein the treatment stations have at least one treatment device into which is able to be introduced into a container, wherein the apparatus has a first and a second transport device for transporting containers, wherein the first transport device feeds the containers at least indirectly to a treatment station, wherein the first transport device is able to be switched off at least temporarily, resulting in the feeding of containers to the treatment station being interrupted, and the second transport device being an at least sectionally linear transport device.

8 Claims, 3 Drawing Sheets

APPARATUS FOR COATING CONTAINERS WITH BYPASS AND METHOD FOR OPERATING SUCH AN APPARATUS

CROSS-REFERENCE TO RELATED APPLICATIONS

This application claims priority to German Application No. 10 2019 126 291.7, having a filing date of Sep. 30, 2019, the entire contents of which are hereby incorporated by reference.

FIELD OF TECHNOLOGY

The following relates to an apparatus and a method for coating containers having an inlet, where containers are handed over to the apparatus, and an outlet, where the containers leave the apparatus having at least one vacuum device for producing a vacuum having at least one treatment station for coating containers with a plasma.

BACKGROUND

For reducing permeability of containers, in particular of plastic containers, e. g. with reference to undesired substances, it is desirable to coat them with a barrier layer. This coating can be performed with the aid of a plasma treatment. Hence, it is customary to provide plants which produce containers and/or treat containers with a coating apparatus, in which containers can be coated.

However, here it is conceivable that also containers should be produced and/or treated which are not meant to be coated. In particular, it can be required that maintenance of the coating plant is performed, while containers are being produced and/or treated without coating. To do this during production operation is not possible or only hardly possible with coating plants known from the conventional art.

SUMMARY

An aspect relates to an apparatus and a method which enables a production operation without treatment of the containers by the coating apparatus. In particular, also a simple way of maintenance of the coating apparatus during production operation should be enabled.

An apparatus according to embodiments of the invention for coating containers has an inlet where containers are handed over to the apparatus, and an outlet, where the containers leave the apparatus. Additionally, the apparatus has at least one vacuum apparatus for producing a vacuum and at least one treatment station for coating containers with a plasma, wherein the treatment station is in fluid connection with the vacuum device and wherein the treatment station has at least one treatment device which is able to be introduced into a container. The apparatus further has a first and a second transport device for transporting containers, wherein the first transport device feeds the containers at least directly to a treatment station.

According to embodiments of the invention, the first transport device is able to be switched off, so that the feeding of containers to the treatment stations is interrupted, and the second transport device is an at least sectionally linear transport device, which is suitable to transport the containers from the inlet to the outlet also during a first transport device being switched off.

This enables a further operation of production, even if the containers are not meant to be coated. As a result, it is possible to switch off the treatment station in which the containers are coated, and still continue the transport of containers. Hence, it is for example simple to perform maintenance of parts which normally move during production operation which includes coating. For example, it can be ensured that rotating carriers, which have one or several containers associated for the purpose of being coated, do not further rotate. It is therefore proposed to lead the containers past the apparatus for coating containers by a bypass.

The containers can be preforms, bottles, cans, KEGS, injections, pouches or the like. They can be made of different materials, such as plastic, glass, metal etc. The apparatus is designated for the coating of plastic preforms.

In a further advantageous embodiment, the second transport device is a turning device for turning the containers. The term "turning of the containers" indicates here that the containers are turned from an upright position into a turned position and/or from a turned position into an upright position. An upright position is understood to be a position of the container in which a bottom of the container faces downwards and/or an opening of the container faces upwards, wherein the directions in each case are understood to be those with respect to gravity. A turned position is understood to be a position of the container in which a bottom of the container faces upwards and/or an opening of the container faces downwards. The turned position is in particular a position being turned by 180° with respect to an upright position.

In an embodiment the second transport device is formed to be circulating. The second transport device has a linear section, along which the containers are able to be moved on a linear transport path. Advantageously, the transport device also has at least one, or two curved sections.

Advantageously, the linear and the curved section or the curved sections are arranged in a plane to each other which plane would approximately pass through the center of the earth, that means in a plane which is substantially perpendicular to a horizontal plane. In this way, the curved sections run advantageously downwards or upwards (with respect to gravity).

The second transport device is designed in a way that the containers can be moved along the linear section or as well at least along a curved section, advantageously along two curved sections. Advantageously, the containers can be turned on the second transport device by transporting them along a curved section.

However, other forms of turning processes are conceivable. For example, the transport device could have grippers which are able to be turned. Advantageously, a turning process can also take place during the transport on a linear transport path.

In an advantageous embodiment, the first and/or the second transport device is a continuously operating transport device, that means, a transport device which continuously transports the containers. In an advantageous embodiment, the containers are here transported at a constant speed. In an advantageous embodiment, a continuous transport, however, can also be understood to be a transport in which the containers are transported at a variable speed. In particular, it is also possible that individual containers are accelerated or decelerated.

In a further advantageous embodiment, a clocked transport and or/a clocked treatment can be provided in the apparatus at least in sections. The coating process can in particular take place in a clocked manner.

In an embodiment, the first and/or the second transport device is designed such that it is able to transport the plastic preforms in a predetermined and in particular also in a uniform orientation with respect to their longitudinal axis. Advantageously, the transport device has a plurality of transport units for transporting one container respectively. Advantageously, the transport units can be holding devices, or the like, which receive the containers to be transported. These are grippers, such as neck handling grippers which grip the containers.

In an advantageous embodiment, the transport units of the first and/or the second transport device are successively arranged in a row. Advantageously, in this way the first and/or the second transport device is suitable to transport the containers in a row, in particular in one lane.

In an advantageous embodiment, the second transport device has a long-stator linear motor. Advantageously, the second transport device enables an individual transport of the containers. Advantageously, the second transport device is suitable to vary the speed of individual containers. The second transport device is suitable to change the distance between individual containers (so-called pitch).

In an advantageous embodiment, a transfer star is arranged upstream and/or downstream of the second transport device. A transport star being arranged upstream is suitable to hand over the containers on to the second transport device and a transfer star being arranged downstream is suitable to receive the containers from the second transport device. The term "handing over" within the scope of embodiments of the invention is understood to be merely a transfer of the container from one device to the next. Hence, this term shall in particular comprise an active removal by an apparatus, as well as a passive receipt by an apparatus. The transfer star can basically be a pitch delay star. However, it is an ordinary transfer star which does not change the pitch.

In an alternative embodiment, the second transport device is a chain-based or a belt-based system. Advantageously, the containers are also in this embodiment transported by a plurality of transport units. In this embodiment, the containers are transported by the second transport device at a constant speed without varying the pitch between the individual containers.

In this alternative embodiment upstream and/or downstream of the second transport device there is a pitch delay star which is able to change the pitch between the containers.

An at least sectionally linear transport device, in particular a transport belt, a transport chain or an individual transport by a linear motor, can likewise be used for the first transport device. The transport device can therefore for example be a chain-based or belt-based system. The use of a long-stator linear motor system would be conceivable here as well.

In an advantageous embodiment, there is a handover point between the first and the second transport device, where the containers are able to be handed over from the first to the second and/or from the second to the first transport device. In an embodiment, containers are able to be handed over at the handover point from the second to the first transport device and at the handover point, which is substantially the same, containers are able to be handed over from the first to the second transport device. The term "substantially" means that embodiments in which the handover takes place slightly offset from each other should also be comprised.

Advantageously, the first and the second transport device are arranged relative to each other in such a way that the containers are initially transported a little bit by the second transport device and are handed over then at the handover point to the first transport device, are transported by the first transport device and are subsequently handed over again to the second transport device at the handover point and are able to be transported further on by the same.

Advantageously, the handover point is at least able to be deactivated temporarily with the result that the containers are not handed over to the first transport device as long as the handover point is deactivated, but remain on the second transport device and are transported further on by the same.

The containers can initially be transported along a curved section by the second transport device with the result that a turning of the containers takes place. The second transport device is designed such that the containers first of all can be received while standing in an upright position and can then be turned into a turned position by the curved section. The handover point is located in the area of the linear section. Advantageously, the handover point is located in an area in which the containers are transported in a turned position with their opening facing downwards.

The second transport device is designed such that the containers are again transported along a curved section after the handover point and that they are in this way turned back again in an upright position.

In a further advantageous embodiment, the apparatus has at least two handling devices for handing over a predefined number of containers from the first transport device in a handover area and for submitting this containers to the first transport device in a submission area, wherein the handling devices have a moveable carrier respectively by which the removed containers can be moved on a transport path, and wherein at least one treating station is assigned to the handling devices respectively.

Advantageously, the transport speed of the handling device is able to be reduced after having submitted the containers. The term "transport speed" is understood to be the speed at which the containers are moved along a transport path. The speed of the containers in the area of the treatment stations is able to be reduced until standstill of the containers.

In an embodiment, one or more containers are handed over to a handling device, while the other containers are transported further on by the transport device. Advantageously, the containers which are transported further on are handed over to a further handling device.

Each handling device is assigned several, in particular stationary, treatment stations. Advantageously, each handling device has at least that number of treatment stations which corresponds to the predefined number of containers which are handed over to the handling device at the handover point in one cycle.

In an embodiment, the handover area and the submission area of a handling device are not spatially separated from each other, but the handover area of a handling device corresponds spatially with the submission/discharge area of a handling device. Advantageously, the handling device is therefore suitable to receive or submit containers in the same area. The handling device is suitable to alternately receive and submit containers.

In an embodiment, not every single transport unit is occupied by a container during a production operation. The apparatus is designed such that every second transport unit is occupied by a container only. In an advantageous embodiment, the occupied and unoccupied transport units are basically designed to be identical.

Advantageously, the apparatus is suitable for containers to be able to be transported by every second transport unit at first (designated as A-gripper for better distinction) in the second transport device and at the handover point a handover takes place to every second transport unit (designated as A-gripper/bracket here as well for better distinction) of the first transport device. The containers can be handed over to the handling devices by the A-grippers and can be coated in treatment stations and subsequently be handed over again to the transport units being offset respectively (for better distinction designated as B-gripper) of the first transport device. Advantageously, the apparatus is designed such that the containers are able to be handed over from this B-grippers of the first transport device to the B-grippers of the second transport device, that is exactly those transport units which have been unoccupied previously.

It is therefore proposed that the apparatus is advantageously designed such that the second transport device is suitable to transport the containers with the aid of transport units before the handover point, which transport units are arranged offset by one transport unit respectively relative to the transport units, which transport the containers after the handover point, if the containers have been handed over to the first transport device. In an advantageous embodiment, the apparatus is designed such that in case of the handover point being switched off, the containers can be transported further on also after the handover point of the second transport device by the same transport units as the ones before the handover point. It is therefore proposed that the apparatus is designed such that the containers can be transported on the second transport device by A-grippers at first and starting from the handover point either be transported on the B-grippers—if a coating should be carried out—or—if no coating should be carried out—be transported on the A-grippers.

Embodiments of the present invention are further aimed at a plant for producing and/or treating containers with an apparatus as described above. Additionally, this plant has advantageously (further) apparatuses for producing and/or treating containers. Advantageously, these individual apparatuses of the plant are connected via transport devices with the result that the containers to be produced and/or to be treated can be transported from one apparatus to the other.

In this plant there is a shaping device provided for coating of containers which is arranged upstream of the apparatus for shaping plastic preforms into plastic containers. In this case, this can advantageously be a blow molding machine. It is advantageous for a heating device to be arranged upstream of the shaping device.

Advantageously, downstream of the apparatus there is at least one cleaning device provided for the coating of containers. In this case, this can be a rinser and/or a sterilization device. Advantageously, downstream of the apparatus for coating containers there is a filling device provided which fills the containers in particular with a liquid, in particular with a beverage.

Advantageously, downstream of the filling device there are further apparatuses provided, such as a closing device and/or a drying station and/or a labelling device and/or a packing device, such as a palletizer.

Advantageously, the pitch of the apparatuses being arranged downstream can be offset electronically. The pitch can in particular be staggered depending on whether a coating should be carried out or not.

In the exemplary embodiment described above, the containers are on the one hand transported by A-grippers at first, and on the other hand, if a coating has taken place and the containers have therefore been removed by the A-grippers and subsequently have been handed over to B-grippers, the containers are transported by B-grippers at the outlet of the apparatus for coating containers. The pitch of the apparatuses being arranged downstream therefore has to be set accordingly so that containers can be received by B-grippers and can be treated further on accordingly. If otherwise, the containers are not coated in the described exemplary embodiment, and therefore remain on A-grippers up to the outlet of the apparatus for coating containers, the pitch of the apparatuses being arranged downstream has to be set accordingly so that the containers are received by A-grippers and are treated further on accordingly.

In an advantageous embodiment, the plant has a servo drive. With the aid of this servo drive the pitch of the production stream can be electronically staggered starting from a certain place. In this case, it can be regulated with respect to which transport unit of the second transport device a transport and/or a treatment has to be synchronized.

Embodiments of the present invention are further directed on a method for operating an apparatus for coating containers, wherein the containers are being handed over at an inlet of the apparatus and leave the apparatus at an outlet, wherein the containers are able to be fed to at least one treatment station at least directly by a first transport device, wherein a vacuum can be produced in the treating station with the aid of a vacuum producing device and the containers are coated with a plasma in the treating station.

According to embodiments of the invention, the first transport unit can be switched off at least temporarily and the containers are transported from the inlet to the outlet by a second transport device, which is an at least sectionally linear transport device, without being fed to a treating station.

Here, the described apparatus is in particular designed and suitable for performing this method as described, that is that all the features elaborated for the apparatus as described above are likewise disclosed for the method as described here and vice versa.

In an advantageous method the containers are turned in the second transport device from an upright position into a turned position and/or from a turned position in an upright position.

In an advantageous method the containers are handed over to the first transport device at a handover point of the second transport device and at the substantially same handover point from the first transport device to the second transport device.

In an embodiment, the containers are initially transported by the second transport device. They are advantageously turned during this transport from an upright position into a turned position. During a production operation where the containers should be coated, the containers are subsequently advantageously handed over from the second transport device to the first transport device. Here, the containers are in a turned position. The containers are at least indirectly fed to the treating stations by the first transport device, in which the containers are coated. Subsequently, the coated containers are handed over from the first transport device to the second transport device at the handover point. The coated containers are turned during the further transport on the second transport device from a turned position into an upright position.

In an advantageous embodiment, the handling device takes a predefined number of containers from the first transport device, moves them on a transport path and hands them over to the first transport device in a submission area, wherein at least one further handling device takes a predefined number of containers from the first transport device in a further submission area, moves them on a transport path and hands them over to the first transport device in a further submission area, wherein the handling device transports the containers on the transport path to at least one of the treating stations being assigned to the handling device.

A process is for example as follows: The handling device is initially in a resting position. As soon as the containers to be treated by the same approach on the transport device, the movement of the handling device starts. Advantageously, this is a rotary movement. The handling device takes a defined number of containers from the transport device and terminates the rotation at the treatment stations. Advantageously, the containers are moved exactly as far as each container has been assigned to a treatment station. The term "assigned" is understood to mean that the container is spatially in close proximity to a treatment station, that is for example directly above, under or beside it. Advantageously, the handling device feeds the containers into the treatment stations and/or the treatment stations take the containers from the handling device.

In an embodiment, the containers are moved on the first transport device and/or the second transport device at constant speed. Advantageously, a continuous container stream runs into the apparatus and again out from it, while only the treatment takes place in a clocked/stationary manner.

However, it is also conceivable that the speed of the transport device varies, for example in order to compensate vacancies in the container stream, or in order to bring the containers into a certain pitch pattern. A possible pitch pattern can already be produced before the apparatus, in an inlet star or in one of the transport devices, the second transport device.

In an advantageous method the second transport device has a plurality of transport units, wherein every second transport unit only transports a container. The first transport device has a plurality of transport units, wherein every second transport unit only transports a container. At the handover point or submission point between the handling devices and the first transport device, when handing over the containers, the receiving and submitting of the containers always takes place alternatingly.

In an advantageous method, the handling device can additionally to the transport movement perform a lifting movement of the containers. A handling device includes a star/a carousel which is able to perform a rotating and a lifting movement. Both movements take place in a clocked manner. Advantageously, a container is immersed into a vacuum chamber of the treatment station, in which a coating process takes place, by a lifting movement.

An advantageous method, in which the containers should be coated, is for example as follows: A pitch delay star takes the containers from a transfer star being arranged upstream and changes the pitch in such a way that every second transport unit (for better distinction indicated as A-gripper) is being equipped. If the second transport device has a long-stator linear motor, a pitch delay star is able to be omitted and the pitch is changed with the aid of the long-stator linear motor. The containers are turned on the second transport device and are handed over to the first transport device at the handover point. The pitch of the first and the second transport device is designed such that also every second transport unit (a-gripper) of the first transport device is equipped.

If the corresponding container bulk arrives at the corresponding treatment station, the containers are taken by A-grippers from the lifting/rotating unit and within the same rotating movement the coated containers are handed over to B-grippers (the previously unoccupied transport units between the A-grippers). If now the containers arrive which are on the B-grippers at the handover point, the containers are handed over to the second transport device on the B-grippers. The containers are turned on the second transport device and subsequently taken by a pitch delay star and handed over to a transfer star.

If the containers (meanwhile) should not be coated, for example because the treatment stations are to be maintained or a certain container type does not need a coating, it can be switched into a "bypass mode". For this purpose, two alternative procedures can be taken into account. Which kind of procedure is chosen depends on the design of the apparatus:

In case of an apparatus where on the second transport device the space between the individual transport units is unchangeable, a method is chosen as the following:

A transfer star hands over the containers to transport units of the second transport device. In this case, every second transport unit only (A-grippers) of the second transport device is equipped with containers. In the coating mode the pitch would normally be implemented by the long-stator linear motor in such a way that the containers are able to be handed over to the first transport device. However, this is not carried out in the bypass mode and the containers are handed over to an outlet star by the A-grippers. That means, the B-grippers are not equipped in the bypass mode. Since the movement of the transport devices can be controlled with the aid of the long-stator linear motor, the transport units can be controlled such that in the bypass mode during handover to the outlet star the (equipped) A-grippers are at that place where the (equipped) B-grippers would be in a coating mode. As a result, the production stream after the apparatus for coating the containers can remain unchanged, since there is no change needed for the same between the coating mode and the bypass mode.

BRIEF DESCRIPTION

Some of the embodiments will be described in detail, with reference to the following figures, wherein like designations denote like members, wherein.

DETAILED DESCRIPTION

Figure 1:
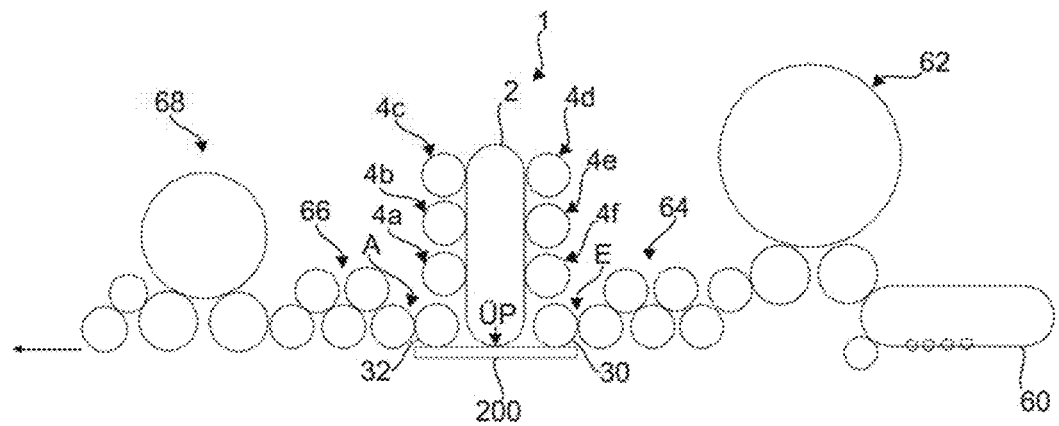
FIG. 1 shows a schematic depiction of a plant with an apparatus according to embodiments of the invention.

FIG. 1 shows a schematic depiction of a plant with an apparatus 1 according to embodiments of the invention. This figure shows therefore by way of example how the apparatus 1 according to embodiments of the invention can be integrated in an entire plant. It can be seen that the containers 10 as preforms (not shown) first of all pass through a heating device 60, subsequently run through a shaping device 62 and here for example are formed into bottles. By a transfer device 64 the containers can be transported from the shaping device 62 up to the inlet E of the apparatus 1 for coating the containers. At the inlet E the containers are taken by an inlet star 30. The inlet star 30 can be a pitch delay star or an ordinary transfer star. The containers 10 are handed over to the second transport device 200 by the inlet star 30.

In the bypass mode, the containers are transported further on up to an outlet star 32 on the transport device 200. The outlet star 32 can be a pitch delay star or an ordinary transfer star. The containers are handed over to a further transfer device 66 by the outlet star 32 at the outlet A and are transported from the transfer device to a filler being located downstream.

In a coating mode, the containers are handed over by the second transport device 200 to a first transport device 2 at the handover point ÜP. In the figure, six handling devices 4a, 4b, 4c, 4d, 4e, 4f are shown along the first transport device. Each of these handling devices can take containers from the first transport device 2 and can feed them to treatment stations where the containers are coated.

Figure 2:
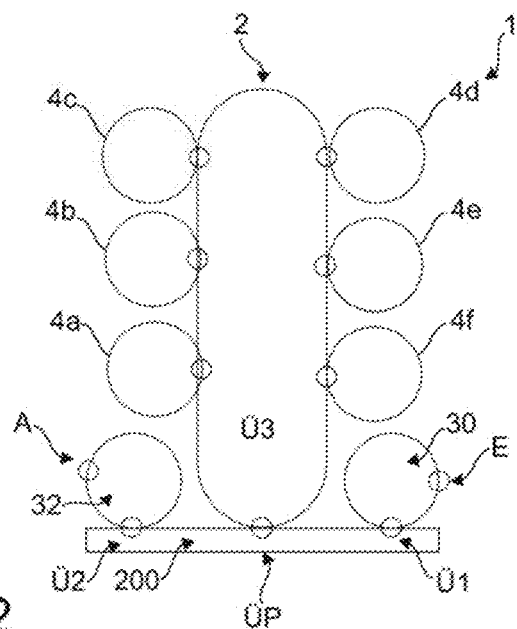
FIG. 2 shows a schematic depiction of an apparatus according to embodiments of the invention.

FIG. 2 shows a schematic depiction of an apparatus 1 according to embodiments of the invention. In this figure, there are handover points where containers are able to be handed over from one apparatus to the next, which are marked with a dot respectively. The inlet E at the inlet star 30 can be recognized as first handover point. The second transport device 200 can further be recognized, which from the inlet star 30 can hand over the containers at a further handover point Ü1. Ü2 marks the handover point where the containers are handed over to the outlet star 32 by the second transport device 200. A marks the outlet. ÜP marks the handover point between the second and the first transport device. There are further possible handover points Ü3 between the first transport device 2 and the various handling devices 4a-4f respectively.

Figure 3:
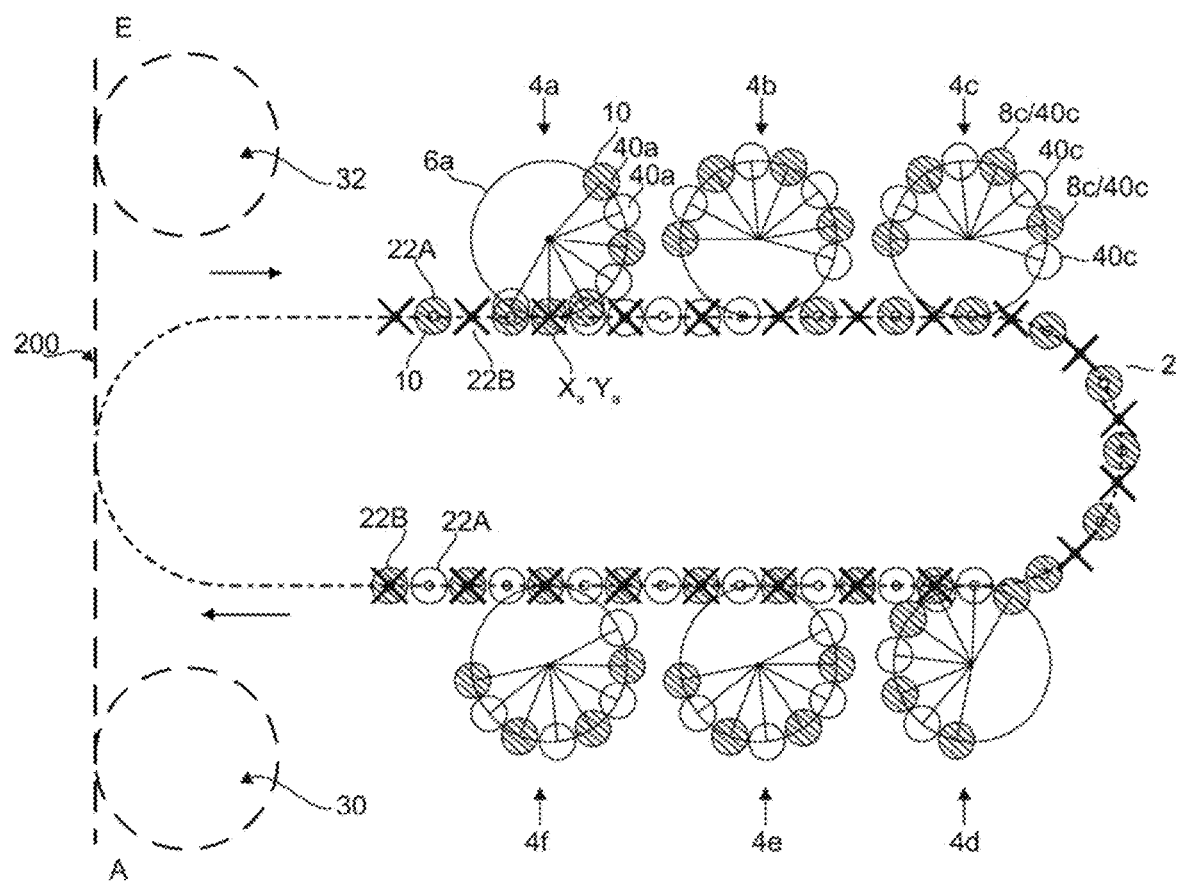
FIG. 3 shows a further schematic depiction of an apparatus according to embodiments of the invention.

FIG. 3 shows a depiction of the apparatus according to embodiments of the invention, where the handling devices 4a-4f are shown more clearly. It can be seen that the first transport device 2 has a plurality of transport units 22. For better distinction, the transport devices are indicated with a circle (22A) or a cross (22B) alternatingly. Hatched circles indicate a container 10.

Several handling devices 4 are arranged around the transport device 2. For the handling device 4a it is exemplarily shown that the handover area Xa and the submission area Ya correspond with each other. It is shown by way of example that the handling device 4a has a carrier 6a and several handling devices 40a (circles at radial lines). These handling devices 40a are alternatingly occupied by a container 10 (hatched circle) or unoccupied (unfilled circle). For clarification this is again indicated at the handling device 4c. Here, the handling device 40c is in such a position that there are handling stations 8c (not shown) below the handling device 40c being occupied by a container 10.

During a procedure in which the containers are to be coated, the handling device 4a rotates for example from this position in a clockwise manner. It hands over at the submission point Ya at first a treated container 10 from the first handling device 40a to an unoccupied transport unit. After the handling device 4a as well as the transport device 2 have moved further on in a synchronized way, the transport device 2 hands over an untreated container 10 from the following occupied transport device 22 to the second (unoccupied) handling device 40a. The transport device 2 and the handling device 4a rotate again further on in a synchronized manner. The handling device 4a hands over the next treated container from the third handling device 40a to the next, unoccupied transport unit 22 etc. As it is recognizable, therefore, at the beginning of the transport device 2 the transport units 22a (marked with a circle) are occupied by a container, while at the end of the transport device the transport units 22B (marked with a cross) are occupied by a container. It is therefore recognizable that the treated containers are transported by the transport units 22B, while the untreated containers are transported by the transport units 22A.

After all those handling units 40a have handed over the treated containers or have received new untreated containers, the handling device 4a rotates further on up to a position in which the handling units 40a being equipped with containers are located above the treatment stations, making it possible for the containers to be treated within them. The handling device 40c is for example in a corresponding position.

Likewise indicated in FIG. 3 are the second transport device 200 and the inlet star 30 or outlet star 32. The transport device 200 can for example be a chain. In this case, the inlet star 30 and the outlet star 32 would be pitch delay stars. If the transport device 200 has a long-stator linear motor, the inlet star 30 and the outlet star 32 could be designed as an ordinary transfer star.

Figure 4:
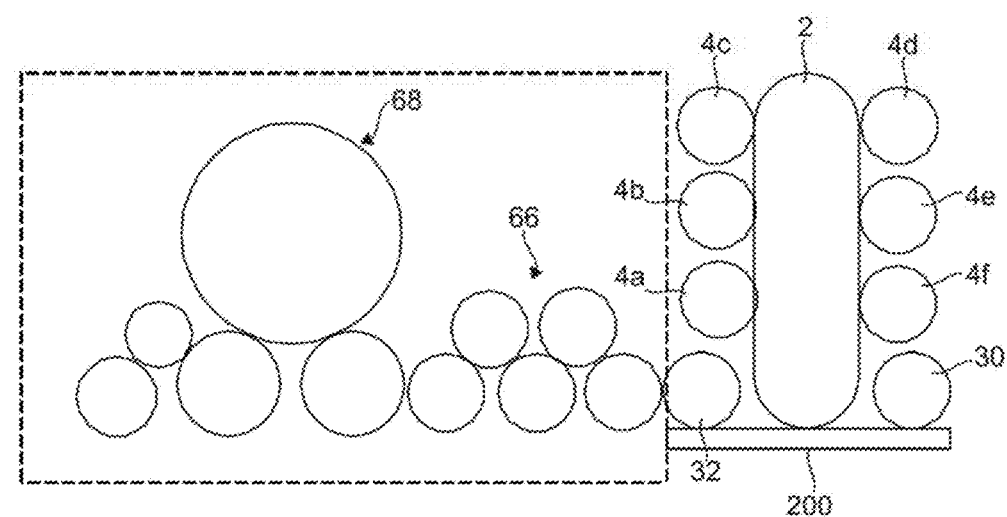
FIG. 4 shows a schematic depiction of an apparatus according to embodiments of the invention with further treatment devices being arranged downstream.

FIG. 4 shows an already described apparatus for coating containers having apparatuses located downstream in the form of a transfer device 66 and a filler 68. How those operated apparatuses 66 and 68 have to be operated in a bypass mode, depends on the embodiment of the second transport device. If this one has a long-stator linear motor, the containers can be transported in the transport direction 200 solely by transport units 22A and the apparatuses 66 and 68 can still be operated in the same way as in a coating mode. Here, the speed of the transport unit has to be adapted merely with the aid of a long-stator linear motor in such a way that there is a transport unit 22A at the handover point Ü2 at that moment where a transport unit 22B would likewise be in a coating mode.

However, if the second transport device 200 is a chain where the distance between the transport units cannot be varied, the transfer devices 66 and the filler 68 (within the dashed area) have to be staggered via an electronic gear.

Figure 5:
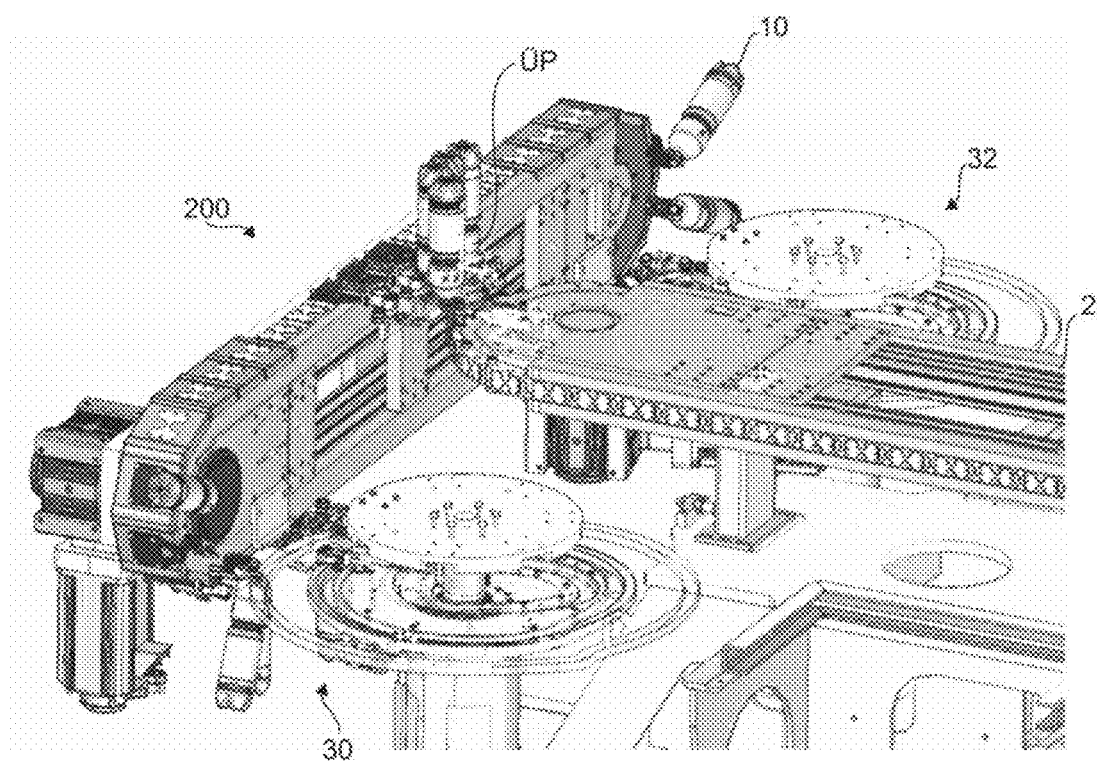
FIG. 5 shows a depiction of a second transport device, which is also a turning device.

FIG. 5 shows a depiction of a second transport device which is also a turning device. An inlet star 30 which is designed as a pitch delay star can be recognized, which hands over containers 10 in an upright position to the second transport device 200. The containers are moved upwards by the transport device 200 over a curved section. Through this movement, the containers 10 are automatically turned so that they are transported in a turned position in the upper area of the second transport device 200. The containers 10 are handed over by the second transport device 200 to the first transport device 2 at the handover point ÜP. After the containers 10 have circulated the first transport device 2, the containers 10 are again handed over at the handover point ÜP to the second transport device 200. The containers are here still in a turned position, since such a position is for a coating. After the containers have been transported along a linear section of the transport device 200, they are transported along a curved section downwards, by which means the containers 10 are again automatically turned into an upright position. The containers 10 are handed over in this upright position to the outlet star 32, which is designed as a pitch delay star.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

REFERENCE NUMERALS 1 apparatus
2 first transport device
4 (a, b, c, . . . ) handling device
6 (a, b, c, . . . ) moveable carrier
8 (a, b, c, . . . ) treatment stations
22 (A, B) transport unit
30 inlet star
32 outlet star
40 (a, b, c . . . ) handling device
60 heating device
62 shaping devices
64 transfer devices
68 transfer devices
68 filler
200 second transport device
800 treatment device
A outlet
E inlet
P (a, b, c, . . . ) transport path
ÜP handover point
X (a, b, c, . . . ) handover area
Y (a, b, c . . . ) submission area

The invention claimed is:

1. An apparatus for coating containers having an inlet, where containers are handed over to the apparatus, and an outlet, where the containers leave the apparatus having at least one vacuum device for producing a vacuum having at least one treatment station for coating containers with a plasma, wherein the treatment station is in fluid connection with the vacuum device and wherein the treatment station has at least one treatment device which is able to be introduced into a container, wherein the apparatus has a first and a second transport device for transporting containers, wherein the first transport device feeds the containers at least indirectly to a treatment station, wherein, the first transport device is at least temporarily able to be switched off resulting in the feeding of containers to the treatment stations being interrupted, and the second transport device is an at least sectionally linear transport device, which is suitable to transport the containers from the inlet to the outlet also while a first transport device is switched off, and wherein the apparatus comprises at least two handling devices for handing over a predefined number of containers from the first transport device in a handover area and for submitting these containers to the first transport device in a submission area, wherein the handling devices respectively have a moveable carrier by way of which the containers being removed are able to be moved on a transport path, and wherein at least one treatment station respectively is assigned with the handling devices.

2. The apparatus according to claim 1, wherein the second transport device is a turning device for turning the containers.

3. The apparatus according to claim 1, wherein the second transport device has a long-stator linear motor.

4. The apparatus according to claim 1, wherein there is a handover point between the first and the second transport device where the containers are able to be handed over from the first to the second and/or from the second to the first transport device.

5. A method for operating an apparatus for coating containers, wherein the containers are handed over to an inlet of the apparatus and leave the apparatus at an outlet, wherein the containers are able to be fed by a first transport device at least indirectly to at least one treatment station, wherein a vacuum is produced within the treatment station by a vacuum producing device and the containers are coated with a plasma in the treatment station, wherein the first transport device is able to be switched off at least temporarily and the containers are transported by a second transport device which is an at least sectionally linear transport device, from the inlet to the outlet without being fed to a treatment station, and wherein a handling device takes a predefined number of containers in a handover area from the first transport device, moves them on a transport path and submits them to the first transport device in a submission area, wherein at least one further handling device receives a predefined number of containers from the first transport device in a further handover region, moves them on a transport path and submits them to the first transport device in a further submission area, wherein the handling devices transports the containers on the transport path to at least one of the treatment stations being assigned to the handling device respectively.

6. The method according to claim 5, wherein the containers are turned in the second transport device from an upright position into a turned position and/or from a turned position into an upright position.

7. The method according to claim 5, wherein the second transport device has a plurality of transport units and every second transport unit only transports a container.

8. The method according to claim 5, wherein a production stream following the second transport device is electronically staggered by half a pitch.

* * * * *